United States Patent [19]
Walton et al.

[11] Patent Number: 5,331,517
[45] Date of Patent: Jul. 19, 1994

[54] RETROFIT CARD FILE ADAPTER ASSEMBLY

[75] Inventors: Richard A. Walton, Carol Stream; Zbigniew Kabat, Chicago; George Lenzi, Wheaton; Herbert A. Didio, Darien, all of Ill.

[73] Assignee: AG Communication Systems Corporation, Phoenix, Ariz.

[21] Appl. No.: 933,121

[22] Filed: Aug. 21, 1992

[51] Int. Cl.5 .............................................. H05K 7/14
[52] U.S. Cl. .................................... 361/796; 361/730; 361/802; 211/41
[58] Field of Search ............... 361/784, 785, 792, 796, 361/728, 729, 730, 736, 752, 809, 810, 807, 797, 802, 788; 211/41; 439/59, 60, 61, 62

[56] References Cited

U.S. PATENT DOCUMENTS

| | | | |
|---|---|---|---|
| 4,429,937 | 2/1984 | Stockmaster | 361/415 |
| 4,750,088 | 6/1988 | Friot | 211/41 |
| 4,894,753 | 1/1990 | Wadell et al. | 174/35 R |
| 4,947,288 | 8/1990 | Olsson et al. | 211/41 |
| 4,964,810 | 10/1990 | Malotke et al. | 361/415 |
| 5,044,506 | 9/1991 | Brown | 211/41 |
| 5,140,501 | 8/1992 | Takahashi et al. | 211/41 |

Primary Examiner—Leo P. Picard
Assistant Examiner—Bot Ledynh
Attorney, Agent, or Firm—Robert J. Black; Gregory G. Hendricks

[57] ABSTRACT

A card file adapter assembly for mounting a plurality printed wiring cards of a smaller size than are normally permitted on an associated electronic equipment mounting rack. The adapter is so constructed in size as to be able to be slid directly into existing mounting hardware of an older type providing mounting space for printed wiring cards of a more reduced size.

10 Claims, 3 Drawing Sheets

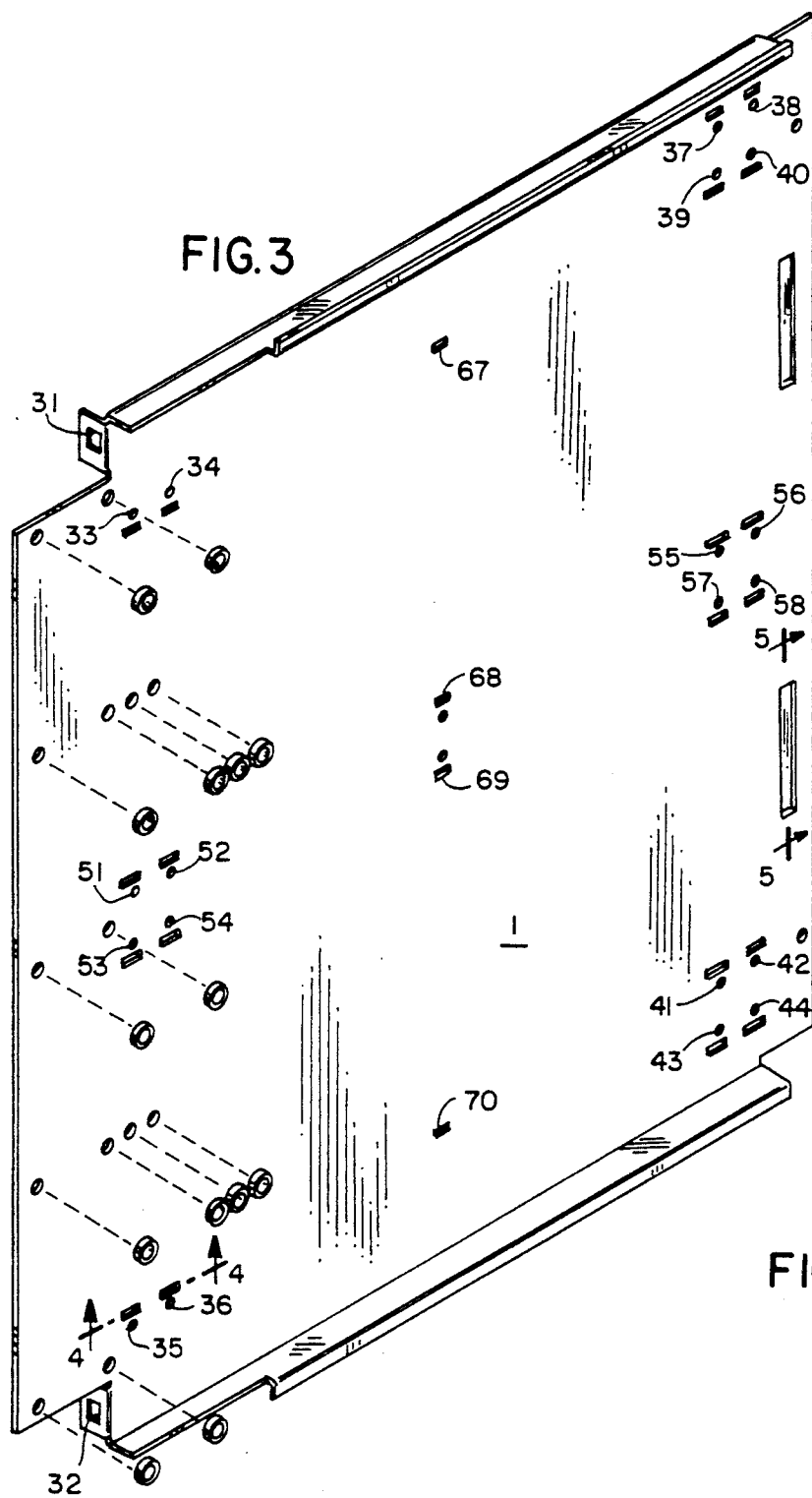
FIG. 3
FIG. 4
FIG. 5

RETROFIT CARD FILE ADAPTER ASSEMBLY

BACKGROUND OF THE INVENTION

1. Field of the Invention

The present invention relates to hardware for mounting printed wiring cards and more particularly to novel card file assembly adapted to facilitate the placement of printed wiring cards employing current packaging methods into existing frame hardware designed to accommodate an older technology.

2. Background Art

At the present time, large computing facilities or telephone central office systems are generally constructed with a number of hardware frames adapted to receive substantial quantities of printed wiring cards. Electrical functions or sub units are provided in increments of such card files mounted in equipment frames. It has been found that implementation of new technology into existing electrical functions is typically provided in new production only. Adaptation of these newer technologies to field implementation is often extremely difficult to accomplish due to substantial mechanical differences particularly as to differences in mounting space between old and new technology hardware.

Where electronic circuitry is incorporated in products which have been in production for a substantial number of years, the amount of technological change over the years can be extremely large. Usually the only way that customers or users of the newer technology receive the benefits of new technology is by ordering new equipment providing additional frame space to mount such new equipment. This latter is the usual case, particularly since existing field locations do not receive the benefits afforded by the newer mounting technologies. Accordingly, it is the object of the present invention to provide a card file design that fits within the envelope size of existing card files. By incorporating new side plate designs it is possible for such provision to allow customers and users to upgrade existing electrical functions to newer technology without encountering many of the pitfalls or difficulties frequently encountered in such situations. The arrangement presented also provides the additional feature of being able to add a completely new function to the unit by utilizing the spare card files of the older technology.

SUMMARY OF THE INVENTION

In order to best accomplish the objective of the present invention there is provided a retrofit module card file assembly. The card file is designed in such a manner to fit within the existing technology card file space. More specifically, the proposed card file assembly, which includes side plates of novel design, fits within the envelope of an existing older technology card file assembly. Since the new card file assembly provides a method to replace or retrofit existing electronic functions with one using more current electronic packaging techniques or methods. The more current method reduces the size required to implement the electronic function by 50% without charging existing frame hardware.

In at least one practical embodiment of the present invention there is provided a retrofit module card file that can house 4U and 8U card sizes but can readily be applied to other physical card sizes. The 4U and 8U card sizes are standard sizes as manufactured by AG Communication Systems Corporation, with 8U card sizes being twice the height of 4U card sizes and thus able to accomplish all the usual circuit density.

The overall retrofit module card file of the present invention height is that of the standard 8U card which fits within an existing double height card file. A key innovation is the sizing of the novel side plates incorporated such that they are dimensionally equivalent in the vertical dimension to the double height cards of existing technology. According to the present invention the retrofit module card file assembly is able to slide completely intact into an existing card file location in the same manner as an existing card. Thus the completed assemblies utilizing the novel side plates of the present invention can now provide the retrofit or upgraded function as far as circuit and mounting techniques are concerned into existing older technology hardware.

BRIEF DESCRIPTION OF THE DRAWINGS

A better understanding of the present invention may be had from a consideration of the following detailed description taken in conjunction with the accompanying drawings in which:

FIG. 3 is a perspective view of a side plate as utilized in a retrofit module card file assembly in accordance with the present invention.

FIG. 4 is a sectional view taken along lines A—A of FIG. 3 showing certain details of mounting bosses as incorporated in the side plates utilized in a retrofit module card file assembly in accordance with the present invention.

FIG. 5 is a sectional view taken along lines B—B of FIG. 3 of a number of similar projections included in the side plate of a retrofit module card file assembly in accordance with the present invention.

DESCRIPTION OF THE PREFERRED EMBODIMENT

Figure 1:
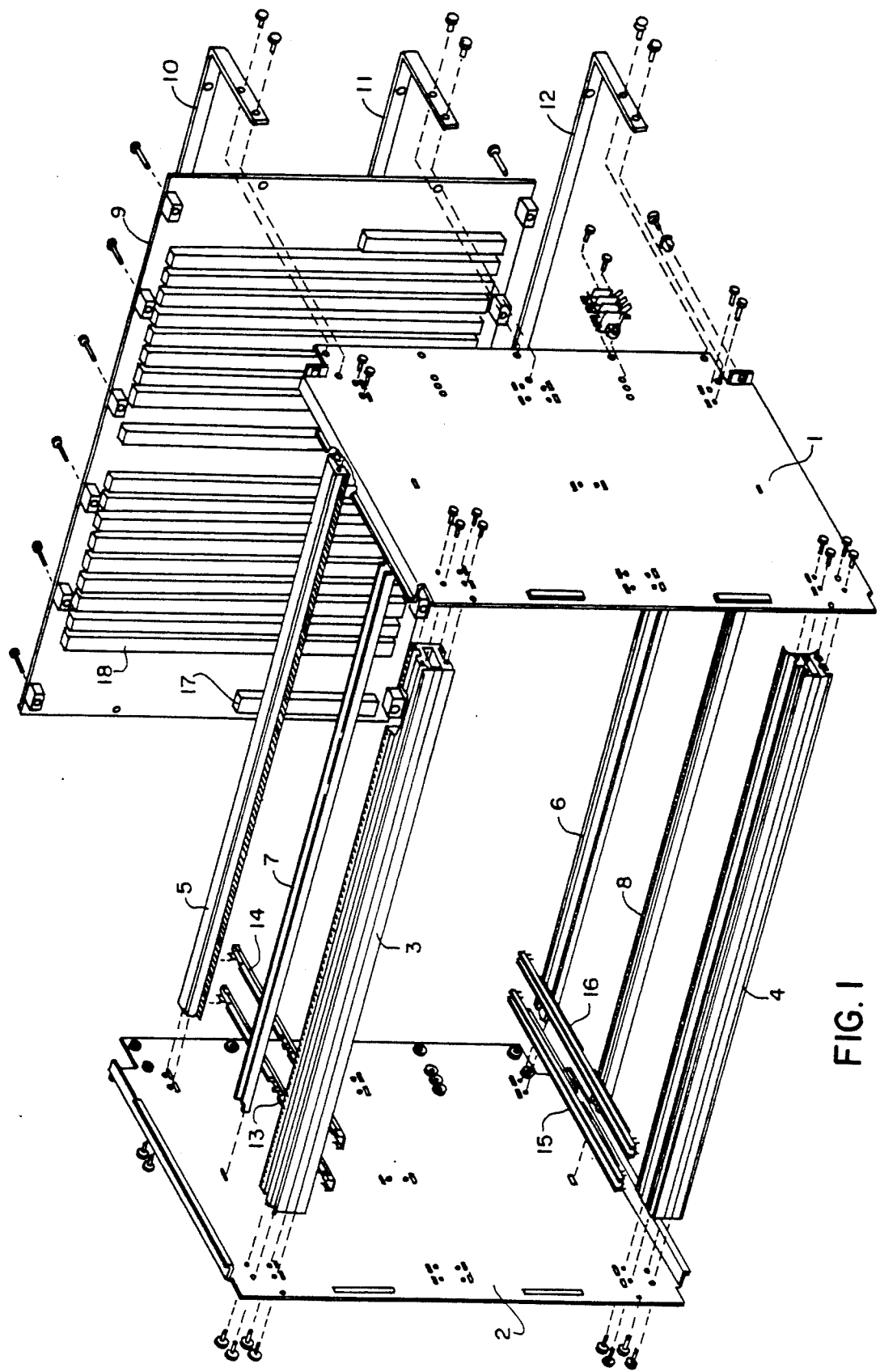
FIG. 1 is an exploded perspective view of a retrofit module card file assembly in accordance with the present invention.
Figure 2:
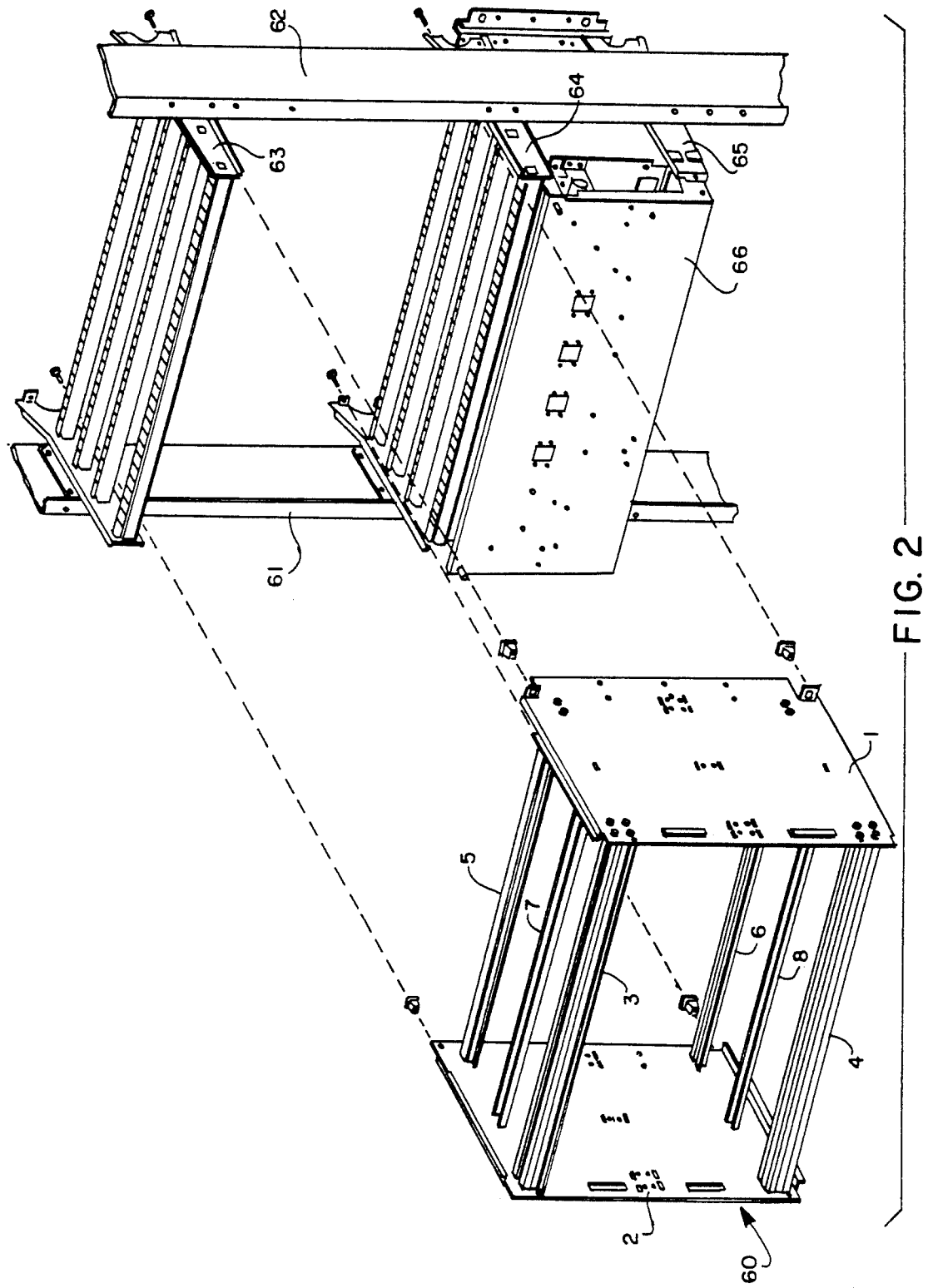
FIG. 2 is a perspective view showing a typical application of the retrofit card file assembly in accordance with the present invention.

Referring now to FIGS. 1 and 2, the retrofit module card file of the present invention is shown in an exploded detail. The card file consists of side plates 1 and 2. Side plate 2 is, as may be seen, a mirror image of side plate 1. Joining side plates 1 and 2 together are top front extrusion 3 and bottom front extrusion 4. Also joining side plates 1 and 2 together are top rear extrusion 5 and bottom rear extrusion 6. The ends of the rear top and bottom extrusions positioned on bosses located adjacent to opening 33, 34, 35 and 36 are all tapped to receive hex head machine screws which are used to secure side plates 1 and 2 to the extrusions in the manner shown. Also providing additional strength and maintaining proper spacing of side plates 1 and 2 are upper card support bracket 7 and lower card support bracket 8. These are anchored into the side plates by tabs on the supports inserted into openings such as 66 to 70 inclusive. Secured into the front and rear top and bottom extrusions are upper card guides 13 and 14 and lower card guides 15 and 16. Card guides 13 and 15 are typically mounted in the even slot position while card guides 14 and 16 are offset slightly (for typical card guide mounting) on the odd slot positions. The extrusions accept projecting fingers on the card guides are assembly techniques well known in the prior art.

Location across the back of the retrofit assembly is backplane 9 which has mounted thereon a number of high density interconnectors shown typically as 17 and 18. The use of such connectors permit a substantially higher number of input and output counts to be used per card. The backplane 9 is assembled to the retrofit module by means of a number of hex head machine screws inserted through bosses projecting from the forward facing portion of a the backplane which are secured into the rear top and bottom extrusions 5 and 6. Extending across the back of the retrofit modules are cable brackets 10, 11 and 12 which facilitate attachment of connecting cables to the card file module assembly. These cable brackets 10, 11 and 12 are secured by means of machine screws or similar devices to the assembly in the manner shown.

Referring now to FIG. 3, details of the side plates 1 and 2 are shown. It being understood that side plate 1 is a mirror image of side plate 2 which is shown in detail in FIG. 3. The side plate is constructed of cold rolled sheet steel and includes a zinc plate yellow chromate plated coating. The most important function of the side plates is that they are of unique design to match the overall dimensions and tolerances of existing printed wiring cards with an older technology. That is to say their design allows them to retrofit the entire module card file assembly utilizing these side plates to rest within the older card files and be locked in place horizontally by the existing card locking mechanism. Most important dimensions, of course, are the height and thickness of the side plates.

Assurance of a good mechanical connection is made by fastening the rear of the side plate in the same locations as existing card file backplane fastening interface.

This is accomplished by means of openings in the ears 31 and 32, grommets as seen in FIG. 1 are inserted and subsequently screws are inserted to match existing hardware backplane connections as may be seen in FIG. 2. A number of openings such as 33, 34, 35, 36, 37, 38, 39, 40, 41, 42, 43 and 44 are included, each of which is adapted to accept an 8-32 self-clinching fastener through which an associated 8-32 hex head screw goes to secure the upper of the top and bottom front and rear extrusions to join the two side plates 1 and 2 together. Adjacent to each of the aforementioned holes is a projecting boss or extrusion whose details may be seen in FIG. 4 which is a cross section of the side plate taken along lines A—A. These bosses are an extension aid in locating the side plates with the top and bottom and front and rear extrusions.

It may also be seen that a related number of holes are located adjacent to bosses 51 through 58, respectively, are shown which would provide for additional mounting of extrusions should it be desired to mount two complete rows of 4U size printed wiring cards in the retrofit module of the present invention. As shown, with the extrusions placed as shown in FIG. 1, the retrofit module is adapted to accept so-called 8U cards which are double the vertical height of the 4U cards.

Referring now to FIG. 2, application of the retrofit card file 60 of the present invention is shown. The entire retrofit card file assembly is shown in the opening of an existing card file assembly, with the existing file assembly hardware consisting of vertical supports 61 and 62 and card supports 63 and 64 being of an older existing type. It is noteworthy to indicate that when replacing equivalent electrical functions the retrofit module card file assembly will replace two of the existing card file assemblies. As may be seen, the side plates 1 and 2 function to guide the new assembly into card guide slots.

From the foregoing it may be seen that the retrofit module card file assembly in accordance with the present invention is designed to facilitate the application of new technology to existing card file locations. It also allows for implementation of new electronic functions in existing unused card file locations. While the card file of the present invention can be implemented in a production environment, it probably will find its greater application in the field where it can easily facilitate the application of the new technology equipment into existing or older type hardware mounting locations.

While but a single embodiment of the present invention has been shown, it will be obvious to those skilled in the art that numerous modifications may be made without departing from the spirit of the present invention which should be limited only by the scope of the claims appended hereto.

What is claimed is:

1. An adapter for use with an electronic equipment mounting rack equipped with support means to support a plurality of printed wiring cards of a first size, said adapter supporting a plurality of printed wiring cards of a second size, said adapter comprising:
    first and second side plates positioned vertically and parallel with each other;
    each of said plates including a top, bottom, front and back;
    first, second, third and fourth extrusions each joining said first plate to said second plate;
    said first extrusion positioned adjacent the top and the front of said first and second side plates;
    said second extrusion positioned adjacent the bottom and the front of said first and second side plates;
    said third extrusion positioned adjacent the top and the back of said first and second side plates;
    said fourth extrusion positioned adjacent the bottom and the rear of said first and second side plates;
    a backplane assembly extending from said first to said second side plate and adjacent to the rear of said side plates;
    said backplane secured to said third and fourth extrusions;
    a pair of printed wiring card support brackets each extending from said first to said second side plates in parallel to each other;
    said adapter dimensioned so as to be supported on said equipment rack by said support means.

2. An adapter as claimed in claim 1 wherein:
    there is further included at least one upper card guide extending from said first extrusion to said third extrusion and at least one lower card guide extending from said second extrusion to said fourth extrusion.

3. An adapter as claimed in claim 2 wherein:
    at least one printed wiring card of said second size is positioned within said adapter positioned between said upper and said lower card guide.

4. An adapter as claimed in claim 1 wherein:
    there is further included at least one cable tie bracket secured to said first and second side plates and adjacent to the rear sides of said side plates.

5. An adapter as claimed in claim 1 wherein:
    there is further included a terminal block secured to a first side of one of said side plates.

6. An adapter as claimed in claim 1 wherein:
each of said side plates further includes means to facilitate the securing of said adapter to said support means of said equipment rack.

7. An adapter as claimed in claim 1 wherein:
there is further included fifth and sixth extrusions intermediate said first and second and said third and fourth extrusions, respectively;
whereby printed wiring cards of a third size may be supported by said adapter.

8. An adapter as claimed in claim 7 wherein:
there is further included at least one card guide extending from said fifth extrusion and said sixth extrusion.

9. An adapter as claimed in claim 8 wherein:
there is further included at least one printed wiring card of a third size positioned within said adapter above said card guide.

10. An adapter as claimed in claim 8 wherein:
there is further included at least one printed wiring card of a third size positioned within said adapter below said card guide.

* * * * *